US 8,003,970 B2

(12) United States Patent
Kim et al.

(10) Patent No.: US 8,003,970 B2
(45) Date of Patent: Aug. 23, 2011

(54) PHASE-CHANGE RANDOM ACCESS MEMORY AND METHOD OF MANUFACTURING THE SAME

(75) Inventors: Cheol-kyu Kim, Seoul (KR); Yoon-ho Khang, Yongin-si (KR); Tae-yon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 373 days.

(21) Appl. No.: 12/073,499

(22) Filed: Mar. 6, 2008

(65) Prior Publication Data
US 2009/0050869 A1 Feb. 26, 2009

(30) Foreign Application Priority Data
Aug. 21, 2007 (KR) .................. 10-2007-0084032

(51) Int. Cl.
*H01L 45/00* (2006.01)
(52) U.S. Cl. ............................ 257/2; 257/3
(58) Field of Classification Search ....... 257/3, E45.002, 257/E21.114; 438/102, 492, 497
See application file for complete search history.

(56) References Cited

U.S. PATENT DOCUMENTS

| | | | |
|---|---|---|---|
| 6,706,585 B2 * | 3/2004 | Uchiyama et al. | 438/240 |
| 2004/0109351 A1 * | 6/2004 | Morimoto et al. | 365/171 |
| 2007/0003730 A1 * | 1/2007 | Kojima et al. | 428/64.4 |
| 2008/0164452 A1 * | 7/2008 | Joseph et al. | 257/3 |
| 2009/0003174 A1 * | 1/2009 | Tsuchino et al. | 369/94 |
| 2009/0029534 A1 * | 1/2009 | Czubatyi et al. | 438/492 |

OTHER PUBLICATIONS

"GeSbTe deposition for PRAM application" by Junghyun Lee, Oct. 2006. Applied Surface Science 253 (2007) 3969-3976.*
("Phase transition characteristics of Bi/Sn doped Ge2Sb2Te5 thin film for PRAM application" Science Direct Thin Solid Films 515 (2007 5049-5033. Nov. 2006.*
("Phase transition characteristics of Bi/Sn doped Ge2Sb2Te5 thin film for PRAM application" Science Direct Thin Solid Films 515 (2007 5049-5033)) by Park et al.*

* cited by examiner

*Primary Examiner* — Wai-Sing Louie
*Assistant Examiner* — Sue Tang
(74) *Attorney, Agent, or Firm* — Harness, Dickey & Pierce, P.L.C.

(57) ABSTRACT

Provided is a phase-change random access memory (PRAM). The PRAM includes a bottom electrode, a bottom electrode contact layer, which is formed on one area of the bottom electrode, and an insulating layer, which is formed on a side of the bottom electrode contact layer, a phase-change layer, which is formed on the bottom electrode contact layer and the insulating layer and is formed of a phase-change material having a crystallization temperature between 100° C. and 150° C., and a top electrode, which is formed on the phase-change layer.

9 Claims, 3 Drawing Sheets

PHASE-CHANGE RANDOM ACCESS MEMORY AND METHOD OF MANUFACTURING THE SAME

CROSS-REFERENCE TO RELATED PATENT APPLICATION

This application claims the benefit of Korean Patent Application No. 10-2007-0084032, filed on Aug. 21, 2007, in the Korean Intellectual Property Office, the disclosure of which is incorporated herein in its entirety by reference.

BACKGROUND OF THE INVENTION

1. Field of the Invention

The present invention relates to a phase-change random access memory (PRAM) and more particularly, to a PRAM which has a low crystallization temperature, and quick operation speed by using a material having a short crystallization time.

2. Description of the Related Art

A phase-change random access memory (PRAM) uses a characteristic of a phase-change material, such as GeSbTe, wherein when an electrical pulse is applied to the phase-change material, a state of the phase-change material changes to crystalline and amorphous states according to heat generated in a localized area. A memory cell, which memorizes PRAM binary information, includes a phase-change layer, a bottom electrode contact (BEC) layer, and a switching device, such as a transistor.

A conventional PRAM includes a transistor, which is formed on a silicon wafer, a BEC layer, which is connected to a transistor source or a drain, and a phase-change layer. A conventional phase change layer is formed of a GST (GeSbTe) based material, on the basis of $Ge_2Sb_2Te_5$ composition. The GST based material is called as chalcogenide, which is the same material as used in an optical recording apparatus, such as a DVD or a CD-RW. The BEC layer is formed in order to heat the phase-change layer. According to the extent of the heating of the phase-change layer, the phase of the conventional PRAM is changed to crystalline and amorphous states, and thus a resistance value changes according to the state of the conventional PRAM. Binary information can be stored and read since a current or voltage changes according to resistance of the phase-change layer.

Operation speed of a PRAM depends on phase-change speed between a crystalline structure and an amorphous structure of the phase-change layer. A GST material used in the conventional PRAM has a high crystallization temperature, and slow crystallization speed. Accordingly, when information is recorded from a set state of a crystalline structure to a reset state of an amorphous structure, a required reset current is high. Also, when information is recorded from a reset state of an amorphous structure to a set state of a crystalline structure, a required set time is equal to or more than 100 nsec, and thus it is difficult to realize a memory that operates in a high speed.

Accordingly, in order to realize a memory which has faster operation speed than a conventional resistance memory, a superior phase-change material should be used.

SUMMARY OF THE INVENTION

The present invention provides a phase-change random access memory (PRAM) including a phase-change layer, which is formed of a material that has lower crystallization temperature and quicker information storing time because of quicker crystalline speed than a GST phase-change material used in a phase-change layer of a conventional PRAM.

According to an aspect of the present invention, there is provided a phase-change random access memory (PRAM) including: a bottom electrode; a bottom electrode contact layer, which is formed on one area of the bottom electrode, and an insulating layer, which is formed on a side of the bottom electrode contact layer; a phase-change layer, which is formed on the bottom electrode contact layer and the insulating layer and is formed of a phase-change material having a crystallization temperature between 100° C. and 150° C.; and a top electrode, which is formed on the phase-change layer.

The phase-change layer may be formed of a material having crystallization time between 1 and 50 nS.

The phase-change layer may be formed of a material having crystallization time between 1 and 20 nS.

The phase-change layer may be formed of any one of $Ge_2(Sb_{1-x}Bi_x)_2Te_5$ (0<x<1) and $Ge_3Bi_2Te_6$ (GBT).

According to another aspect of the present invention, there is provided a method of manufacturing a PRAM, the method including: forming a bottom electrode; forming an insulating layer on the bottom electrode; forming a contact hole, which exposes the bottom electrode, on the insulating layer, and forming a bottom electrode contact layer by coating a resistive heater; and forming a phase-change layer, which has crystallization temperature between 100° C. and 150° C., on the insulating layer and the bottom electrode contact layer.

The $Ge_2(Sb_{1-x}Bi_x)_2Te_5$ (0<x<1) may be formed using ALD or CVD by supplying a Ge precursor, a Sb precursor, a Bi precursor, and a Te-precursor.

The $Ge_2(Sb_{1-x}Bi_x)_2Te_5$ (0<x<1) may be evaporated, sputter deposited, or deposited using PLD by using Ge, Sb, Bi, and Te sources.

The Ge precursor may include at least one material of $(CH_3)_4Ge$, $(C_2H_5)_4Ge$, $(n-C_4H_9)_4Ge$, $(i-C_4H_9)_4Ge$, $(C_6H_5)_4Ge$, $(CH_2=CH)_4Ge$, $(CH_2CH=CH_2)_4Ge$, $(CF_2=CF)_4Ge$, $(C_6H_5CH_2CH_2CH_2)_4Ge$, $(CH_3)_3(C_6H_5)Ge$, $(CH_3)_3(C_6H_5CH_2)Ge$, $(CH_3)_2(C_2H_5)_2Ge$, $(CH_3)_2(C_6H_5)_2Ge$, $CH_3(C_2H_5)_3Ge$, $(CH_3)_3(CH=CH_2)Ge$, $(CH_3)_3(CH_2CH=CH_2)Ge$, $(C_2H_5)_3(CH_2CH=CH_2)Ge$, $(C_2H_5)_3(C_5H_5)Ge$, $(CH_3)_3GeH$, $(C_2H_5)_3GeH$, $(C_3H_7)_3GeH$, $Ge(N(CH_3)_2)_4$, $Ge(N(CH_3)(C_2H_5))_4$, $Ge(N(C_2H_5)_2)_4$, $Ge(N(i-C_3H_7)_2)_4$, and $Ge[N(Si(CH_3)_3)_2]_4$.

The Sb precursor may include at least one material of $Sb(CH_3)_3$, $Sb(C_2H_5)_3$, $Sb(i-C_3H_7)_3$, $Sb(n-C_3H_7)_3$, $Sb(i-C_4H_9)_3$, $Sb(t-C_4H_9)_3$, $Sb(N(CH_3)_2)_3$, $Sb(N(CH_3)(C_2H_5))_3$, $Sb(N(C_2H_5)_2)_3$, $Sb(N(i-C_3H_7)_2)_3$, and $Sb[N(Si(CH_3)_3)_2]_3$.

The Bi precursor may include at least one material of $Bi(Ph)_3$, and $Bi(TMHD)_3$.

The Te-precursor may include at least one material of $Te(CH_3)_2$, $Te(C_2H_5)_2$, $Te(n-C_3H_7)_2$, $Te(i-C_3H_7)_2$, $Te(t-C_4H_9)_2$, $Te(i-C_4H_9)_2$, $Te(CH_2=CH)_2$, $Te(CH_2CH=CH_2)_2$, and $Te[N(Si(CH_3)_3)_2]_2$.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
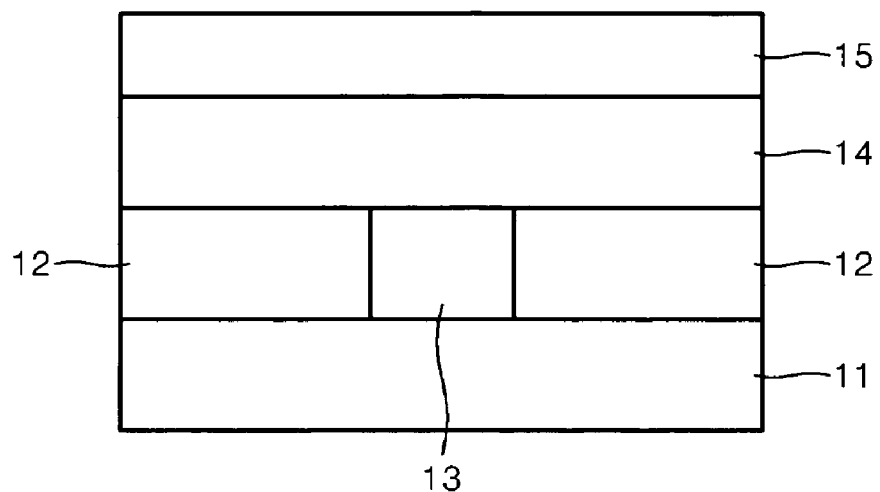
FIG. 1 is a diagram illustrating a phase-change random access memory (PRAM) according to an embodiment of the present invention.

Hereinafter, the present invention will be described more fully with reference to the accompanying drawings, in which exemplary embodiments of the invention are shown. In the drawings, the thicknesses of layers and regions are conceptually illustrated for clarity.

FIG. 1 is a diagram illustrating a phase-change random access memory (PRAM) according to an embodiment of the present invention.

Referring to FIG. 1, a bottom electrode contact layer 13 is formed on an area of a bottom electrode 11, and an insulating layer 12 is formed on a side of the bottom electrode contact layer 13. A phase-change layer 14 is formed on the insulating layer 12 and the bottom electrode contact layer 13, and a top electrode 15 is formed on the phase-change layer.

Materials forming each layer of the PRAM and a method of manufacturing the PRAM will now be described.

The bottom electrode 11 may be formed of a conductive material, and is formed of a metal or a metal oxide. The insulating layer 12 is laminated on the bottom electrode 11 using a dielectric material, such as $SiO_2$, SiON, and $Si_3N_4$. A contact hole, which exposes the bottom electrode 11, is formed on the insulating layer 12, and the bottom electrode contact layer 13 is formed by depositing a resistive heater. An insulating layer 12 is laminated on the bottom electrode 11 using a dielectric material, such as $SiO_2$, SiON and $Si_3N_4$. A contact hole, which exposes the bottom electrode 11, is prepared on the insulating layer 12, and a resistive heater is deposited on the contact hole so as to form the bottom electrode contact layer 13. Then, the phase-change layer 14 is formed on the insulating layer 12 and the bottom electrode contact layer 13. The bottom electrode contact layer 13 is formed of a resistive heater, and heats the phase-change layer 14 according to an applied set pulse or reset pulse. The bottom electrode contact layer 13 is formed of TiN or TiAlN. The bottom electrode contact layer 13 may be formed narrower than the bottom electrode 11. Accordingly, the bottom electrode contact layer 13 has a small contact area, and thus increases a heating efficiency of the phase-change layer 14. Also, the top electrode 15 is formed on the phase-change layer 14. The top electrode 15 is formed of a conductive material, such as a metal or a metal oxide, like the bottom electrode 11.

In the PRAM according to the current embodiment of the present invention, the phase-change layer 14 has crystallization temperature lower than a conventional GST phase-change material, and is formed of a material having short crystallization time. In detail, the crystallization temperature may be equal to or lower than 150° C., preferably between 100° C. and 150° C. The crystallization time may be between 1 and 50 nS, and preferably between 1 and 20 nS. Examples of a material having above characteristics include $Ge_2(Sb_{1-x}Bi_x)_2Te_5$ (0<x<1) and $Ge_3Bi_2Te_6$ (GBT). The PRAM may be formed through various PVDs, such as evaporation, sputter deposition, and PLD, or processes, such as ALD and CVD.

When the phase-change layer 14 is formed of $Ge_2(Sb_{1-x}Bi_x)_2Te_5$, the phase-change layer 14 may be formed by supplying each Ge precursor, Sb precursor, Bi precursor, and Te-precursor, or by evaporating Ge, Sb, Bi, and Te source. Here, examples of each precursor are as follows.

The Ge precursor may be one of $(CH_3)_4Ge$, $(C_2H_5)_4Ge$, $(n-C_4H_9)_4Ge$, $(i-C_4H_9)_4Ge$, $(C_6H_5)_4Ge$, $(CH_2=CH)_4Ge$, $(CH_2CH=CH_2)_4Ge$, $(CF_2=CF)_4Ge$, $(C_6H_5CH_2CH_2CH_2)_4Ge$, $(CH_3)_3(C_6H_5)Ge$, $(CH_3)_3(C_6H_5CH_2)Ge$, $(CH_3)_2(C_2H_5)_2Ge$, $(CH_3)_2(C_6H_5)_2Ge$, $CH_3(C_2H_5)_3Ge$, $(CH_3)_3(CH=CH_2)Ge$, $(CH_3)_3(CH_2CH=CH_2)Ge$, $(C_2H_5)_3(CH_2CH=CH_2)Ge$, $(C_2H_5)_3(C_5H_5)Ge$, $(CH_3)_3GeH$, $(C_2H_5)_3GeH$, $(C_3H_7)_3GeH$, $Ge(N(CH_3)_2)_4$, $Ge(N(CH_3)(C_2H_5))_4$, $Ge(N(C_2H_5)_2)_4$, $Ge(N(i-C_3H_7)_2)_4$, and $Ge[N(Si(CH_3)_3)_2]_4$.

The Sb precursor may be one of $Sb(CH_3)_3$, $Sb(C_2H_5)_3$, $Sb(i-C_3H_7)_3$, $Sb(n-C_3H_7)_3$, $Sb(i-C_4H_9)_3$, $Sb(t-C_4H_9)_3$, $Sb(N(CH_3)_2)_3$, $Sb(N(CH_3)(C_2H_5))_3$, $Sb(N(C_2H_5)_2)_3$, $Sb(N(i-C_3H_7)_2)_3$, and $Sb[N(Si(CH_3)_3)_2]_3$.

The Bi precursor may be $Bi(Ph)_3$ or $Bi(TMHD)_3$.

Also, the Te-precursor may be one of $Te(CH_3)_2$, $Te(C_2H_5)_2$, $Te(n-C_3H_7)_2$, $Te(i-C_3H_7)_2$, $Te(t-C_4H_9)_2$, $Te(i-C_4H_9)_2$, $Te(CH_2=CH)_2$, $Te(CH_2CH=CH_2)_2$, and $Te[N(Si(CH_3)_3)_2]_2$.

Figure 2:
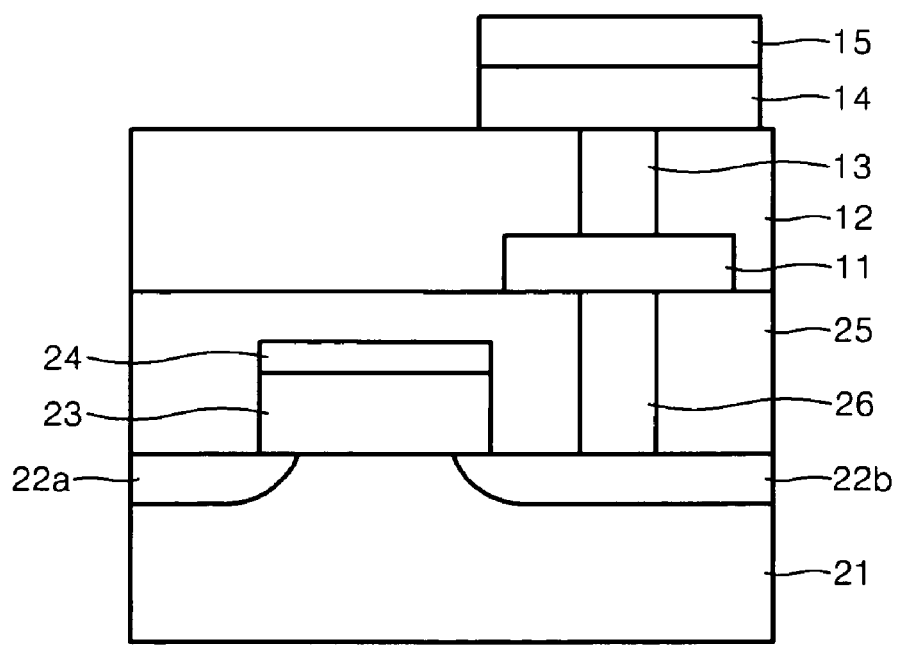
FIG. 2 is diagram illustrating a PRAM connected to a transistor.

FIG. 2 is diagram illustrating a PRAM connected to a switching device. Here, the switching device is a switching transistor formed on a substrate 21.

Referring to FIG. 2, a source 22a and a drain 22b are included in the substrate 21, and a gate insulating layer 23 and a gate electrode 24 are sequentially formed on the substrate 21 between the source 22a and the drain 22b, as a gate structure. An interlayer insulating layer 25 is formed on such a switching transistor, and a contact hole, which exposes the drain 22b, is formed on the interlayer insulating layer 25. A conductive plug 26 is formed in the contact hole. A bottom electrode 11 is formed on the conductive plug 26, a bottom electrode contact layer 13 is formed on one area of the bottom electrode 11, and an insulating layer 12 is formed on a side of the bottom electrode contact layer 13. A phase-change layer 14 is formed on the insulating layer 12 and the bottom electrode contact layer 13, and a top electrode 15 is formed on the phase-change layer 14.

Figure 3:
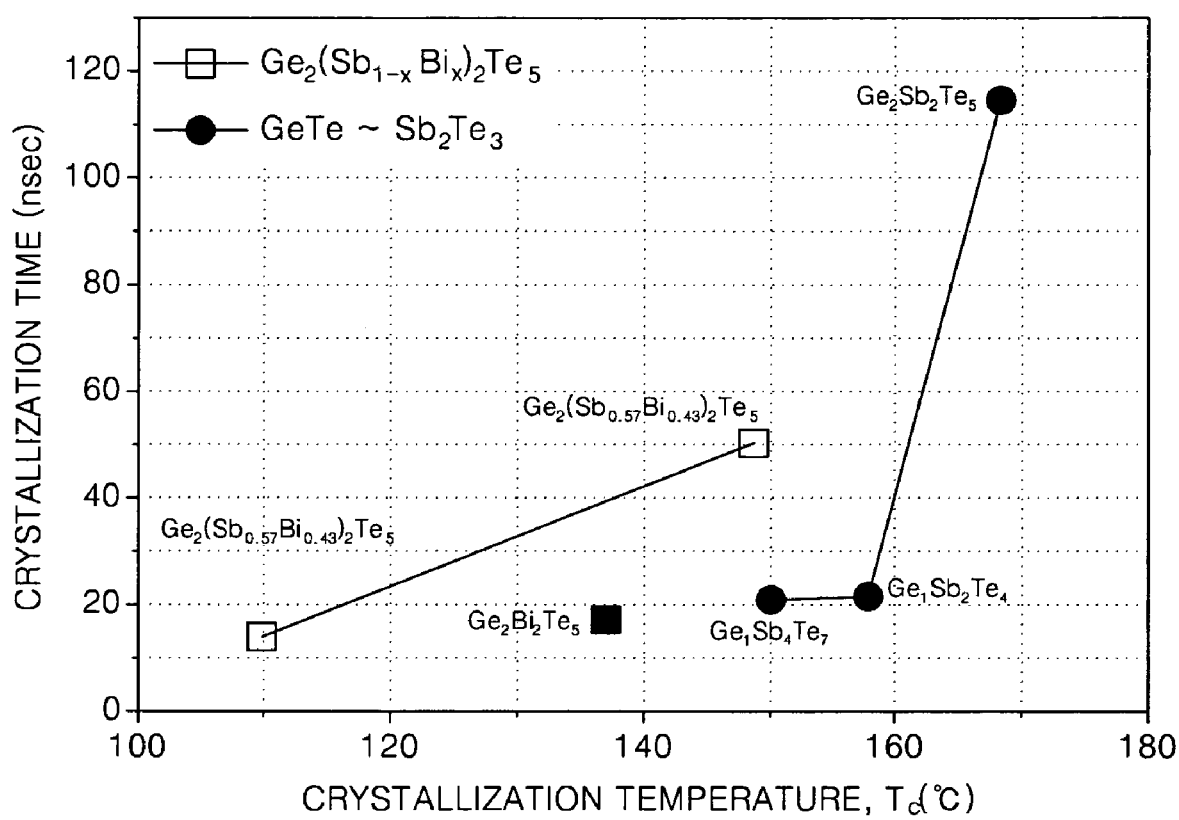
FIG. 3 is a graph illustrating crystallization temperature and crystallization time according to a phase-change material.

FIG. 3 is a graph illustrating crystallization temperature and crystallization time according to a phase-change material. In FIG. 3, crystallization time of three materials, GST, GSBT, and GBT, which are chalcogenide material, is shown according to crystallization temperature. Referring to FIG. 3, when a material, such as $GST(Ge_2Sb_2Te_5)$, which is used in a conventional PRAM is used, crystallization temperature is relatively high, and crystallization time is also long. However, according to the PRAM of the present invention, data recording time can be remarkably reduced by using a phase-change material, such as GSBT, which has low crystallization temperature and short crystallization time. Also, according to the PRAM of the present invention, data integrity can be efficiently improved through a process of re-recording recorded data by using a phase-change material, having relatively low crystallization temperature, as a storage node.

Figure 4:
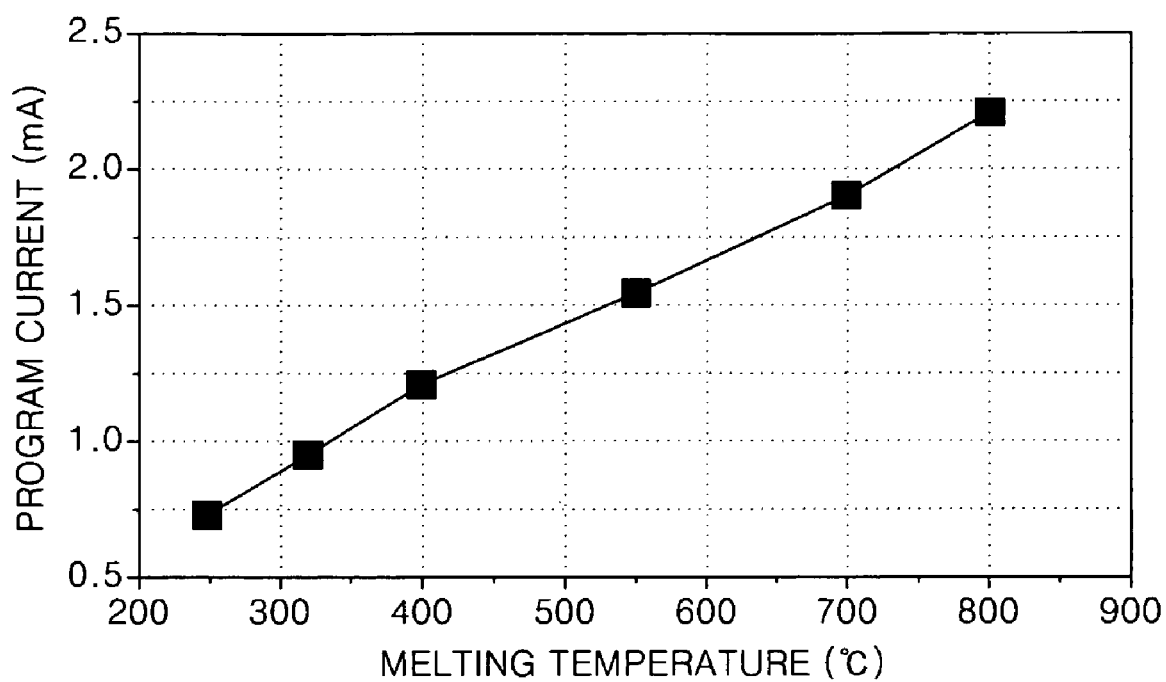
FIG. 4 is a graph illustrating a programming current amount according to phase-change temperature.

FIG. 4 is a graph illustrating a programming current amount according to phase-change temperature of a phase-change material of a PRAM. In other words, FIG. 4 illustrates temperature of a PRAM cell according to a current supplied to the PRAM cell.

Referring to FIG. 4, when phase-change temperature of the phase-change layer of the PRAM is approximately 250° C., a programming current value is approximately 0.75 mA. Meanwhile, when phase-change temperature is approximately 400° C., a programming current value remarkably increases to approximately 1.25 mA. Accordingly, in a PRAM, it can be seen that a current value required in programming can be remarkably reduced by using a phase-change material that has low crystallization temperature.

According to the present invention, a PRAM, in which a phase-change layer of a storage node of the PRAM is formed of a material having lower phase-change temperature and shorter phase-change time than a conventional GST phase-change material.

Accordingly, data storing time can be remarkably reduced, and a programming current required in storing data can be remarkably decreased. Also, data integrity can be efficiently improved through a process of re-recording recorded data by using a phase-change material, having relatively low crystallization temperature, as a storage node.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a PRAM, the method comprising:
    forming a bottom electrode;
    forming an insulating layer on the bottom electrode;
    forming a contact hole, which exposes the bottom electrode, on the insulating layer, and forming a bottom electrode contact layer by coating a resistive heater; and
    forming a phase-change layer, which has crystallization temperature greater than or equal to 100° C., but less than 150° C., on the insulating layer and the bottom electrode contact layer, wherein
        the phase-change layer is formed of any one of $Ge_2(Sb_{1-x},Bi_x)_2Te_5$ (0<x<1) and $Ge_3Bi_2Te_6$ (GBT).

2. The method of claim 1, wherein the phase-change layer is formed of a material having crystallization time between 1 and 50 nS.

3. The method of claim 2, wherein the phase-change layer is formed of a material having crystallization time between 1 and 20 nS.

4. The method of claim 1, wherein the $Ge_2(Sb_{1-x},Bi_x)_2Te_5$ (0<x<1) is formed using ALD or CVD by supplying a Ge precursor, a Sb precursor, a Bi precursor, and a Te-precursor.

5. The method of claim 4, wherein the Ge precursor comprises at least one material selected from the group consisting of $(CH_3)_4Ge$, $(C_2H_5)_4Ge$, $(n-C_4H_9)_4Ge$, $(i-C_4H_9)_4Ge$, $(C_6H_5)_4Ge$, $(CH_2=CH)_4Ge$, $(CH_2CH=CH_2)_4Ge$, $(CF_2=CF)_4Ge$, $(C_6H_5CH_2CH_2CH_2)_4Ge$, $(CH_3)_3(C_6H_5)Ge$, $(CH_3)_3(C_6H_5CH_2)Ge$, $(CH_3)_2(C_2H_5)_2Ge$, $(CH_3)_2(C_6H_5)_2Ge$, $CH_3(C_2H_5)_3Ge$, $(CH_3)_3(CH=CH_2)Ge$, $(CH_3)_3(CH_2CH=CH_2)Ge$, $(C_2H_5)_3(CH_2CH=CH_2)Ge$, $(C_2H_5)_3(C_5H_5)Ge$, $(CH_3)_3GeH$, $(C_2H_5)_3GeH$, $(C_3H_7)_3GeH$, $Ge(N(CH_3)_2)_4$, $Ge(N(CH_3)(C_2H_5))_4$, $Ge(N(C_2H_5)_2)_4$, $Ge(N(i-C_3H_7)_2)_4$, and $Ge[(N(Si(CH_3)_3)_2]_4$.

6. The method of claim 4, wherein the Sb precursor comprises at least one material selected from the group consisting of $Sb(CH_3)_3$, $Sb(C_2H_5)_3$, $Sb(i-C_3H_7)_3$, $Sb(n-C_3H_7)_3$, $Sb(i-C_4H_9)_3Sb(t-C_4H_9)_3$, $Sb(N(CH_3)_2)_3$, $Sb(N(CH_3)(C_2H_5))_3$ $Sb(N(C_2H_5)_2)_3$, $Sb(N(i-C_3H_7)_2)_3$, and $Sb[N(Si(CH_3)_3)_2]_3$.

7. The method of claim 4, wherein the Bi precursor comprises at least one material selected from the group consisting of $Bi(Ph)_3$, and $Bi(TMHD)_3$.

8. The method of claim 4, wherein the Te-precursor comprises at least one material selected from the group consisting of $Te(CH_3)_2$, $Te(C_2H_5)_2$, $Te(n-C_3H_7)_2$, $Te(i-C_3H_7)_2$, $Te(t-C_4H_9)_2$, $Te(i-C_4H_9)_2$, $Te(CH_2=CH)_2$, $Te(CH_2CH=CH_2)_2$, and $Te[N(Si(CH_3)_3)_2]_2$.

9. The method of claim 1, wherein the $Ge_2(Sb_{1-x},Bi_x)_2Te_5$ (0<x<1) is evaporated, sputter deposited, or deposited using PLD by using Ge, Sb, Bi, and Te sources.

* * * * *